United States Patent [19]

Kagayama

[11] Patent Number: 5,099,272
[45] Date of Patent: Mar. 24, 1992

[54] IMAGE RECORDING APPARATUS WITH A DEVELOPER COATING DEVICE

[75] Inventor: Shigeru Kagayama, Owariasahi, Japan

[73] Assignee: Brother Kogyo Kabushiki Kaisha, Nagoya, Japan

[21] Appl. No.: 680,729

[22] Filed: Apr. 5, 1991

[30] Foreign Application Priority Data

Jul. 3, 1990 [JP] Japan ............................ 2-176080

[51] Int. Cl.⁵ ................. G03B 27/32; G03B 27/52; G03B 27/58
[52] U.S. Cl. ............................................. 355/27; 355/72
[58] Field of Search ................... 355/32, 27, 72; 430/138; 346/150; 118/651, 657

[56] References Cited

U.S. PATENT DOCUMENTS

| | | | |
|---|---|---|---|
| 4,825,256 | 4/1989 | Nakai et al. | 355/27 |
| 4,864,353 | 9/1989 | Okamoto | 355/27 |
| 4,933,708 | 6/1990 | Asano et al. | 355/32 |
| 4,974,015 | 11/1990 | Maeda | 355/27 |
| 4,985,727 | 1/1991 | Sakai et al. | 355/27 |

Primary Examiner—Richard A. Wintercorn
Attorney, Agent, or Firm—Oliff & Berridge

[57] ABSTRACT

An image recording unit comprises a photosensitive recording unit portion storing the photosensitive recording medium, and a developer unit portion for coating the developer particles on the photosensitive recording medium on which latent images are formed by exposure to light reflected by the original, the photosensitive recording medium being supplied from the photosensitive recording medium unit, and comprising a capsule sheet. The image recording unit comprises a single cassette including the photosensitive recording unit portion and the developer unit portion. According to the image recording unit of this present invention, when the entire capsule sheet is taken up and all the developer particles are used up, the capsule sheet and the developer particles can quickly and easily be exchanged simultaneously.

20 Claims, 3 Drawing Sheets

IMAGE RECORDING APPARATUS WITH A DEVELOPER COATING DEVICE

BACKGROUND OF THE INVENTION

1. Field of the Invention

The present invention relates to an image recording apparatus for recording an image on an image recording medium, and more particularly to an image recording apparatus which develops by coating a developer on a photosensitive recording medium on which the latent image is formed based on information about an image.

2. Description of Related Art

Conventionally, an image recording apparatus for recording an image on a recording medium with a capsule sheet (photosensitive recording medium) having microcapsules as described in the U.S. Pat. No. 4,399,209 is used. Each of the microcapsules encapsulates therein a chromogenic material and a photosensitive material which changes mechanical strength according to the amount of the irradiated light to which it is exposed.

One of the above mentioned image recording apparatuses is disclosed in Japanese Pat. Application No. 2-33260.

First, the structure of the image recording apparatus and operation for recording an image will be described with reference to FIG. 4.

An operator opens an original support stand glass cover 102a mounted on the image recording apparatus and puts an original 103 on a support stand glass 102 facing down. The operator then places the original support stand glass cover 102a on the original 103. Next, when the operator presses a start switch (not shown), an exposure lamp 101 is lit, and an image recording operation is started. The light emitted from the exposure lamp 101 irradiates the original 103 placed on the original support stand glass 102, and the light is reflected by the original 103. The light reflected by the original 103 carries information about an image. The reflected light irradiates a capsule sheet 105 supplied from a cartridge 104 and is focused on the capsule sheet 105 through a lens. The capsule sheet 105 has a conductive substrate on which numerous microcapsules are coated. When the reflected light irradiates the microcapsule side of the capsule sheet 105, a latent image of the original image is formed on the microcapsule side. At this time, the original support stand glass 102 on which the original is placed is moved by a drive source (not shown). The capsule sheet 105 moves in synchronization with the movement of the original support stand glass 120. The latent image of the original image is thus formed on the microcapsule side of the capsule sheet 105. An unused capsule sheet 105 is stored on a capsule sheet roll 106 in the cartridge 104 and a used capsule sheet 105 is taken up by a take up roll 112 in the cartridge 104 through guide rollers 107, 108, 109, 110, 111 and a development roller 118b. As A.C. power is connected to the take up roller 112, a voltage can be applied to a substrate of the capsule sheet 105. When developer particles 115 come in contact with a chromogenic material involved in the microcapsules, the developer particles 115 react on the chromogenic material and are colored.

A developer coating unit 113 comprises a case 114, a charging roller 116 and a carrying roller 117. The developer particles 115 are stored in the case 114. As the charging roller 116 comes in contact with the developer particles 115 and causes friction, the developer particles 115 become charged. The carrying roller 117 transmits the developer particles 115 to come in contact with the capsule sheet 105 by rotation of the carrying roller 117 having the charged developer particles 115 on its surface. When the capsule sheet 105 on whose microcapsule side the latent image of the original image is formed by the light reflected by the original 103 passes the front of a developer coating unit 113, the developer particles 115 are drawn electrostatically to the latent image from the carrying roller 117. As the take up roll 112 is connected to the A.C. power supply, the substrate of the capsule sheet 105 can be applied a voltage.

The capsule sheet 105 forming the latent image coated by the developer particles 115 is carried to a pressure development unit 118. Just before the capsule sheet 105 forming the latent image is introduced into the pressure development unit 118, the latent image portion of the capsule sheet 105 is superposed with ordinary paper 119 delivered from a cassette 122. The capsule sheet 105 and the ordinary paper 119 are introduced into the pressure development unit 118 together, and they are sandwiched and pressed together between development rollers 118a and 118b. At this time, microcapsules which are hardened by receiving the reflected light are not ruptured under the pressure, while the microcapsules which are not hardened by the reflected light are ruptured under the pressure. As chromogenic material flows from the ruptured microcapsules, the chromogenic material comes in contact with the developer particles 115 and reacts with them to cause coloring. Accordingly, a recording image is formed on the ordinary paper 119 corresponding to the original image. Afterwards, the ordinary paper 119 is separated from the capsule sheet 105 by the guide roller 109 and the capsule sheet 105 is taken up by the take up roll 112. On the other hand, after the ordinary paper 119 on which the recording image has been formed is separated from the capsule sheet 105, the ordinary paper 119 is heated and fixed by a fixing unit 120 for fixing the recording image on the ordinary paper 119. The ordinary paper 119 on which the recording image has been fixed is discharged through an outlet 121 to the exterior of the image recording apparatus and is finally laid on the discharge tray 123.

According to the above mentioned image recording apparatus, if the image recording operation is executed many times and the entire capsule sheet 105 is taken up by the take up roll 112, the capsule sheet 105 is used up. When the capsule sheet 105 is used up, the operator opens a maintenance panel (not shown) provided on the upper side of the exterior of the image recording apparatus and exchanges the used cartridge 104 for a new cartridge 104 to store an unused capsule sheet 105. Moreover, when the entire capsule sheet 105 is taken up by the take up roll 12 in the cartridge 104 and is thus used up, the developer particles 115 in the developer coating unit 113 are almost used up as a result of being coated to the capsule sheet 105. Therefore, the operator also has to exchange the empty developer coating unit 113 for a new developer coating unit 113 to store the developer particles 115. Accordingly, the operator has to open the maintenance panel and exchange both the cartridge 104 and the developer coating unit 113 for a new cartridge 104 and a new developer coating unit 113, respectively, since the capsule sheet 105 and the developer particles 115 are used up almost at the same time. Therefore, the exchanging operation is troublesome.

Moreover, because the cartridge 104 and the developer coating unit 113 are separately provided in the image recording apparatus, this image recording apparatus must be large in size.

SUMMARY OF THE INVENTION

It is therefore an object of the present invention to provide an image recording unit for enabling an operator to exchange a capsule sheet unit and a developer coating unit without difficulty.

It is a further object of the present invention to provide an image recording apparatus which is compact.

To achieve these objects, the image recording unit of the present invention is installed in the image recording apparatus detachably, the image recording unit comprising: a photosensitive recording medium unit portion storing a photosensitive recording medium; and a developer coating unit portion for coating the developer particles on the photosensitive recording medium to be supplied from the photosensitive recording medium unit, a latent image of an original image according to light carrying information about the original image being formed on the photosensitive recording medium.

According to this image recording unit, as the photosensitive recording unit portion and the developer coating unit portion are integrated, the photosensitive recording medium and the developer particles are exchanged simultaneously. Thus, as the developer particles are almost used up when the entire photosensitive recording medium is taken up by the take up roll, an operator opens a maintenance panel installed on the upper side of the image recording apparatus and only exchanges the used image recording unit for a new image recording unit. Moreover, as the photosensitive recording medium unit portion and the developer coating unit portion are integrated, the image recording apparatus can be made more compact.

BRIEF DESCRIPTION OF THE DRAWINGS

The above and other objects, features and advantages of the invention will become more apparent from reading the following description of the preferred embodiments taken in connection with the accompanying drawings in which.

DETAILED DESCRIPTION OF THE PREFERRED EMBODIMENTS

Referring now to the accompanying drawings, a preferred embodiment of the present invention will be described in detail.

Figure 1:
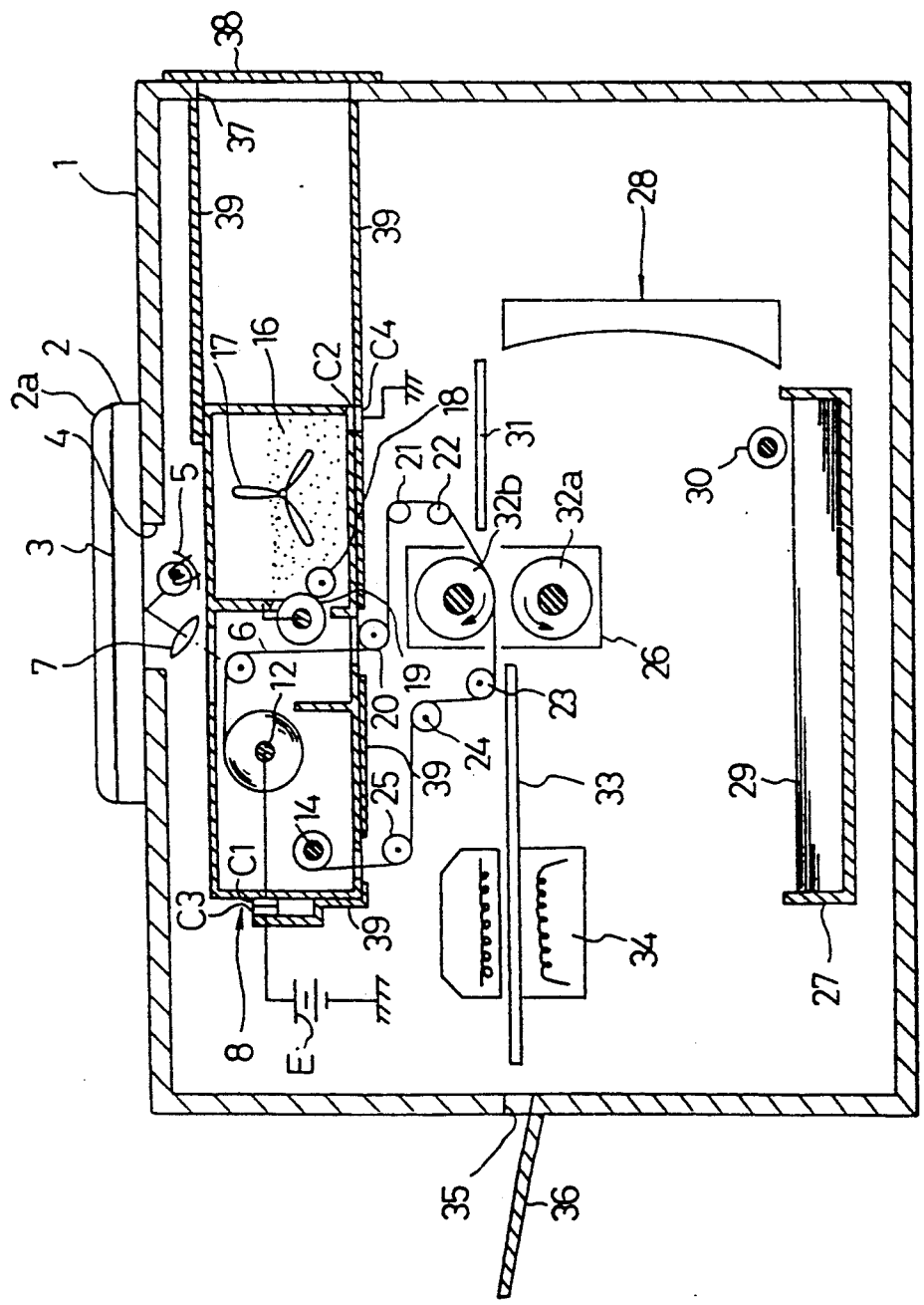
FIG. 1 is a schematic view showing an image recording apparatus in which an image recording unit of the present invention is installed.
Figure 2:
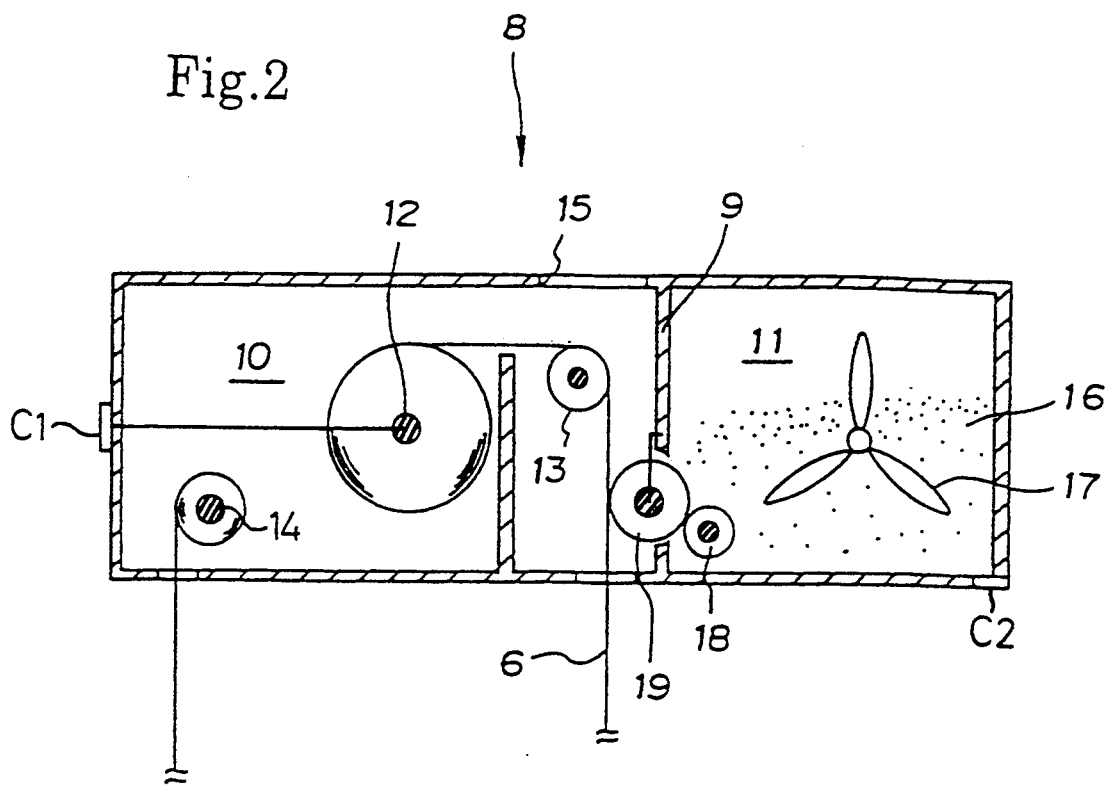
FIG. 2 is a schematic sectional view showing an image recording unit of the present invention.

Initially, the construction of an image recording unit of an embodiment which embodies the image recording unit according to the present invention will be described with reference to FIGS. 1 and 2. FIG. 1 is a schematic view showing the image recording apparatus in which the image recording unit is installed, and FIG. 2 is a schematic sectional view showing the image recording unit of the first embodiment of the present invention.

According to the image recording apparatus, an original support stand glass 2 and an original support stand glass cover 2a are mounted on the upper side of a device body 1. The original support stand glass cover 2a can be opened and shut on the original support stand glass 2. Therefore, an operator can put the original 3 on the original support stand glass 2. At this time, the operator put the original 3 with the side on which an image is formed on the original support stand glass 2.

On the side of the device body 1, an outlet 35 is provided from which ordinary paper 29 having the image formed thereon is discharged, a discharge try 36 on which the ordinary paper 29 is to be finally laid being located at outlet 35.

On the other side of the device body 1, an aperture 37 through which cassette 8 is capable of being inserted or discharged, and open-close panel 38 comprising the maintenance panel which is capable of covering the aperture 37 are provided. This open-close panel 38 is attached to the device body 1, for example, by a well-known hinge. Therefore, the open-close panel 38 is able to move between a first position in which the open-close panel 38 covers the aperture 37 and a second position in which the open-close panel 38 does not cover the aperture 37 centering around the hinge. This open-close panel 38 usually covers the aperture 37 with the exception of when the user changes the cassette 8.

A slit 4 is provided in the upper part of the device body 1. The above mentioned original support stand glass 2 is mounted on the upper side of the device body 1 and covers the slit 4. An exposure lamp 5 for irradiating an original 3 placed on the original support stand glass 2 is provided below the slit 4. The light is radiated from the exposure lamp 5 and is reflected by the image side of the original 3 such that the light carries information about an image. Therefore, when the light reflected to a capsule sheet 6 of a web type as a photosensitive recording medium is focused by a lens 7 and makes an image formation, the latent image of the original image is formed on the microcapsule side of the capsule sheet 6. The capsule sheet 6 is stored in a cassette 8 which is detachably installed in the image recording apparatus. The capsule sheet 6 has the same construction as the capsule sheet used for the image recording apparatus which is disclosed in Japanese Pat. Application No. 2-33260.

Furthermore, cassette holding casings 39 which detachably hold the cassette 8 are provided in the upper portion of the device body 1. A connector C3 which is connected with the D.C. power supply E, and a connector C4 which is grounded are provided on the cassette holding casings 39. When the cassette 8 is properly installed in the cassette holding casings 39, the connector C3 is connected with a connector C1, and the connector C4 is connected with a connector C2. The connectors C1 and C2 are mentioned hereafter.

As shown in FIG. 2, the cassette 8 as the image recording unit is formed as a box of substantially rectangular shape. A partition wall 9 provided at almost the center of the cassette 8 partitions the cassette 8 into two parts. One part is the first portion 10 corresponding to the photosensitive recording unit portion and another part is the second portion 11 corresponding to the developer coating unit portion. As shown in FIG. 2, the first portion 10 is to the left of the partition wall 9 and the second portion 11 is to the right of the partition wall 9.

A capsule sheet roll 12 set in the first portion 10 stores an unused capsule sheet 6. The capsule sheet 6 is fed out of the cassette 8 by a guide roller 13 provided in the first portion 10. The capsule sheet 6 fed out of the cassette 8 is taken up by the take up roll 14 in the first portion 10 through the guide rollers 20, 21, 22, 23, 24, 25 and a development roller 32b. An exposure window 15 is formed on the upper portion, which is almost directly above the guide roller 13, of the cassette 8. The above mentioned reflected light enters the exposure window 15 to the first portion 10, and forms a latent image of the original image on the microcapsule side of the capsule sheet 6 in the cassette 8.

Moreover, the grainy developer particles 16 are stored in the second portion 11, and are stirred and mixed by rotation of an agitator 17 having three wings. A charging roller 18 is set in the second portion 11. The charging roller 18 comprises a shaft and a brush which is installed around the shaft. The brush is made of positively charged insulation fiber materials such as nylon and acrylic fiber. The shaft is made of a metal such as copper and aluminum. A carrying roller 19 is arranged to come in contact with the charging roller 18. The carrying roller 19 has a shaft made of a metal such as copper and aluminum. Many ditches are formed on the surface of the carrying roller 19 in order to transport many developer particles 16.

Furthermore, the two connectors C1, C2 are provided at the outside of the cassette 8. The connector C1 is connected with the capsule sheet roll 12. The connector C1 is further insulated from cassette 8. The connector C2 is connected to the shaft of the carrying roller 19 and the body of the cassette 8. As mentioned above, when the cassette 8 is properly installed in the cassette holding casings 39, the connector C1 is connected with the connector C3, and the connector C2 is connected with the connector C4. Accordingly, the installation of the cassette 8 is automatically indicated by the electrical connection of the connector C1 and the connector C3, and the connector C2 and the connector C4. Further, the detachment of the cassette 8 is automatically indicated by the cut-off of the electrical connection of the connector C1 and the connector C3, and the connector C2 and the connector C4. These connectors C1, C2, C3, C4 comprise terminals made by, for example, springs or flat plate electrodes.

A sheet cassette 27, a sheet feeding unit 28 and a feed roller 30 are arranged in the lower portion of the device body 1.

The ordinary paper 29 on which an image is to be recorded is laid and stored in the sheet cassette 27.

Feed roller 30 removes the ordinary paper 29 laid and stored in the sheet cassette 27 one-by-one, and delivers the ordinary paper 29 to the sheet feeding unit 28.

The sheet feeding unit 28 transmits the ordinary paper 29 delivered by the feed roller 30 to a guide 31 arranged near the center of the device body 1.

The guide 31, a pressure development unit 26, a feeding guide 33 and a fixing unit 34 are arranged near the center of the device body 1.

The guide 31 supports and guides the ordinary paper 29 fed from the sheet feeding unit 28 to the pressure development unit 26.

The pressure development unit 26 comprises the development rollers 32a and 32b for sandwiching and pressing the capsule sheet 6 having the latent image and the ordinary paper 29 together. When the pressure development operation is executed, the image is transferred onto the ordinary paper 29.

The feeding guide 33 supports and guides the ordinary paper 29 on which the image is formed in the pressure development unit 26 to the fixing unit 34 and finally discharges the paper 29 from the image recording apparatus.

The fixing unit 34 heats the ordinary paper 29, and fixes the image on the ordinary paper 29 tightly.

The ordinary paper 29 with the image fixed thereon is discharged through the outlet 35 provided on the side of the device body 1 from the image recording apparatus and is laid on the discharge tray 36.

Next, the operation of the image recording apparatus of the first embodiment will be described with reference to FIG. 1 and FIG. 2.

First, the operator opens the original support stand glass cover 2a and sets an original 3 whose image is desired to be recorded on the original support stand glass 2. At this time, the original 3 is placed on the original support stand glass 2 with the side which has the image thereon facing the glass. Next, after the operator shuts the original support stand glass cover 2a, the operator presses the start switch (not shown) of the image recording apparatus. When the image recording operation begins, an exposure lamp 5 is lit. When the exposure lamp 5 is lit, the light from the exposure lamp 5 irradiates the original 3 placed on the original support stand glass 2. The light radiated from the exposure lamp 5 to the image side of the original 3 is reflected by the image side. The light reflected by the image side carries information about the image of the original 3. The reflected light having information about the image is focused onto the capsule sheet 6 by the lens 7 and exposes microcapsules to form an electrostatic latent image of the original image on the microcapsule side of the capsule sheet 6. The capsule sheet 6 on which the latent image of the original image is formed is delivered to guide roller 20. At this time, a positive voltage is applied from the power supply E to a conduction layer of the capsule sheet 6. On the other hand, the developer particles 16 stored in the second portion 11 of the cassette 8 are rubbed by rotation of the charging roller 18, and are negatively charged. The negatively charged developer particles 16 are supported on the surface of the charging roller 18. As the charging roller 18 rotates, the developer particles 16 supported on the surface of the charging roller 18 are transmitted to the carrying roller 19. In the above mentioned embodiment, as the charging roller 18 and the carrying roller 19 are arranged to come in contact with each other and the carrying roller 19 is grounded, the developer particles 16 transmitted from the charging roller 18 are delivered to the surface of the carrying roller 19. Since the carrying roller 19 rotates, the developer particles 16 supported on the surface of the carrying roller 19 are transmitted. Thus, the developer particles 16 are confronted with the capsule sheet 6. As a positive voltage is applied to the conduction layer of the capsule sheet 6, the negatively charged developer particles 16 are transmitted by the carrying roller 19 and are drawn to the capsule sheet 6 electrostatically. The developer particles 16 drawn electrostatically are coated uniformly on the microcapsule side of the capsule sheet 6 on which the latent image is formed. The capsule sheet 6 on which the developer particles 16 are coated is carried to the pressure development unit 26 by the guide rollers 21 and 22.

The ordinary papers 29 stored in the sheet cassette 29 are removed one-by-one by the feed roller 30, and transmitted from the guide 31 to the pressure development unit 26 by the sheet feeding unit 28. Just before the ordinary paper 29 is introduced into the pressure development unit 26, the ordinary paper 29 is closely held against the latent image formed on the capsule sheet 6. The ordinary paper 29 and capsule sheet 6 are pressurized and developed by the developer rollers 32a and 32b. At this time, as microcapsules become hardened by being irradiated by the light, the hardened microcapsules are not ruptured under the pressure, but the unhardened microcapsules are ruptured. As chromogenic material flows from each of the ruptured microcapsules, the chromogenic material comes in contact with and reacts with the developer particles and is colored. Therefore, the recorded image corresponding to the original image is formed on the ordinary paper 29. Afterwards, the ordinary paper 29 is separated from the capsule sheet 6 by the guide roller 23, and the capsule sheet 6 is taken up by the take up roll 14. On the other hand, after the ordinary paper 29 on which the recording image is formed is separated from the capsule sheet 6, the ordinary paper 29 is heated by the fixing unit 34 so that the recorded image is fixed on the ordinary paper 29. The ordinary paper 29 on which the recorded image is fixed is discharged through the outlet 35 to the exterior of the image recording apparatus and is finally laid on the discharge tray 36.

Accordingly, if the operator places the original 3 on the original support stand glass 2 and presses the start switch, information about the image of the original 3 is copied on the ordinary paper 29 and the ordinary paper 29 having the image thereon is output through the outlet 35. Whenever the ordinary paper 29 is output, the capsule sheet 6 is exposed and taken up, and the developer particles 16 are consumed. When the entire capsule sheet 6 is taken up and used up, the cassette 8 has to be exchanged for a new cassette 8 storing an unused capsule sheet 6. Moreover, when the developer particles 16 are used up, the cassette 8 has to be exchanged for a new cassette 8 storing the developer particles 16. When a new cassette 8 storing an unused capsule sheet 6 is needed, the new cassette 8 storing the developer particles 16 is usually needed. According to the image recording apparatus of the present invention, if the operator opens the open-close panel 38 of the apparatus and exchanges the cassette 8 for a new cassette 8, the operator can exchange the capsule sheet 6 and the developer particles 16 simultaneously. As a result, the exchanging work of the capsule sheet 6 and the developer particles 16 becomes easy. Moreover, since the first portion 10 storing the capsule sheet 6 and the second portion 11 storing the developer particles 16 are provided in the cassette 8 adjacent each other, the image recording apparatus for the cassette 8 can become more compact. Further, when the mechanisms such as a capsule sheet roll 12, take up roll 14, an agitator 17, a charging roller 18 and a carrying roller 19 are exhausted, the operator need only exchange a single cassette 8. Thus, the maintenance improves.

Next, the image recording unit for another embodiment of this invention will be explained with reference to FIG. 3.

Figure 3:
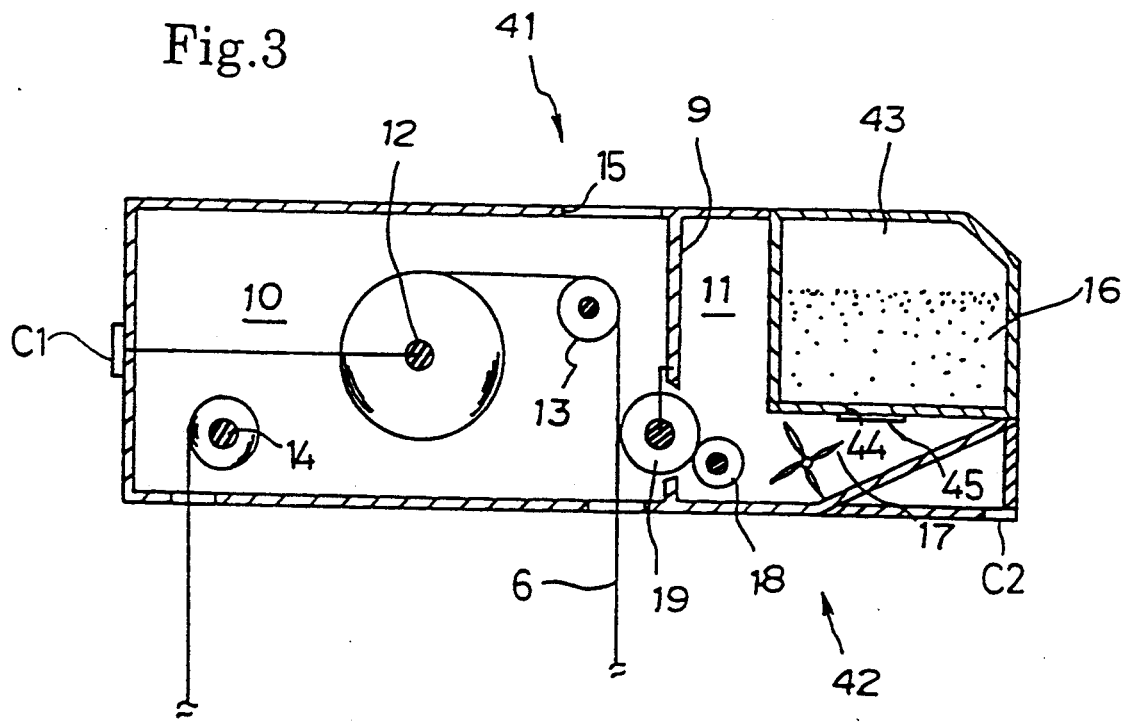
FIG. 3 is a schematic sectional view showing an image recording unit of another embodiment of the present invention.
Figure 4:
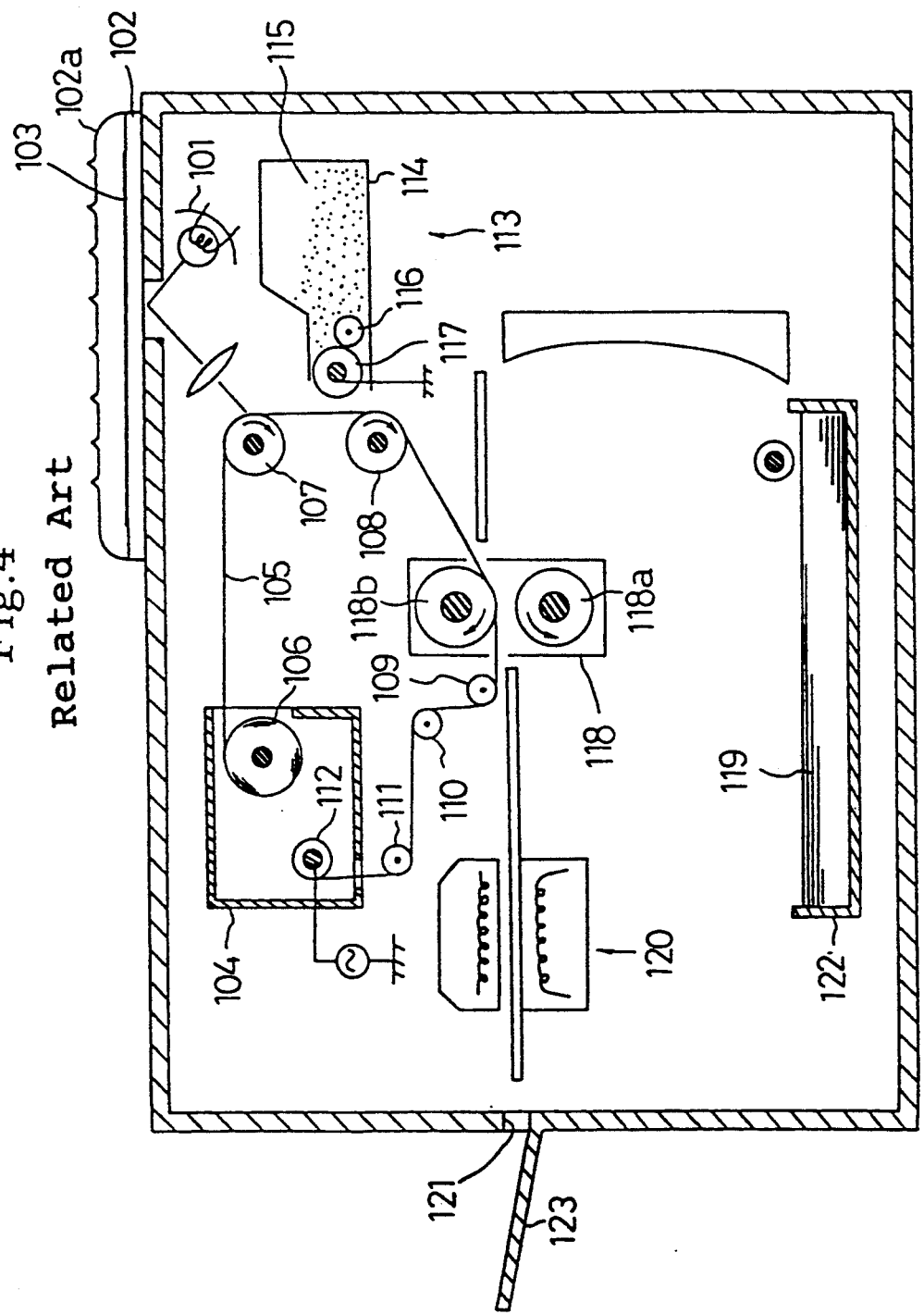
FIG. 4 is a schematic view showing a conventional image recording apparatus.

FIG. 3 is a schematic sectional view showing an image recording unit for another embodiment of this invention. In a second portion 11 of the cassette 41, a developer coating portion 42 comprises an agitator 17, a charging roller 18, a carrying roller 19, and a developer supplying portion 43 for storing the developer particles 16. Only the developer supplying portion 43 is capable of separating from the developer coating portion 42. In the cassette 41, the operator is able to exchange only a used developer supplying portion 43 for a new developer supplying portion 43 when the developer particles 16 are used up. A cover 45 for covering an aperture 44 is arranged below the developer supplying portion 43. The cover 45 is opened to allow the developer particles 16 to drop downward when the developer supplying portion 43 is set in the cassette 8. When the developer particles 16 are rapidly used up because, for example, the information about the image of the original is complex, a great volume of an unused capsule sheet 6 often remains. At this time, the operator can exchange only the developer supplying portion 43 in the cassette 41 for a new developer supplying portion 43. Therefore, the unused capsule sheet 6 can be fully used, thus reducing the cost for the cassette 41.

According to the present invention, a photosensitive recording medium unit portion and a developer unit portion are integrated, and both portions become one image recording unit. Accordingly, if the operator exchanges the image recording unit for a new image recording unit, the photosensitive recording medium and the developer particles can be exchanged simultaneously. The exchange is, therefore, very easy for the operator. Moreover, as the photosensitive recording medium unit portion and the developer unit portion are provided in one location in the image recording apparatus, this image recording apparatus can be made compact.

Moreover, in the cassette 41 providing the developer unit portion for detachably supporting the developer supplying portion, an unused photosensitive recording medium can be fully used, so that the cost for the image recording unit can be reduced.

While the invention has been described in conjunction with specific embodiments thereof, it is evident that many alternatives, modifications and variations will be apparent to those skilled in the art. Accordingly, the preferred embodiments of the invention as set forth herein are intended to be illustrative, not limiting. Various changes may be made without departing from the spirit and scope of the invention as defined in the following claims.

What is claimed is:

1. An image recording unit installed in an image recording apparatus, said image recording unit comprising:
   a photosensitive recording medium unit portion storing and supplying a photosensitive recording medium; and
   a developer coating unit portion for coating the developer particles on said photosensitive recording medium supplied from said photosensitive recording medium unit portion, a latent image of an original image according to light carrying information about the original image being provided on said photosensitive recording medium,
   said photosensitive recording medium unit portion and said developer coating unit portion being provided in a single, detachable unit in said image recording apparatus.

2. The image recording unit according to claim 1, wherein said developer coating unit portion is partitioned into a developer supplying portion for storing developer particles and a developer coating portion, the developer supplying portion being detachably installed in said developer coating unit portion.

3. The image recording unit according to claim 2, wherein said photosensitive recording medium unit portion has an exposure window.

4. The image recording unit according to claim 3, wherein said exposure window is positioned to enable light carrying information about the original image to pass therethrough, said light forming a latent image of said original image on said photosensitive recording medium.

5. The image recording unit according to claim 1, wherein said photosensitive recording medium unit portion has an exposure window.

6. The image recording unit according to claim 5, wherein said exposure window is positioner to enable light carrying information about the original image to pass therethrough, said light forming a latent image of said original image on said photosensitive recording medium.

7. An image recording unit in an image recording apparatus, said image recording unit comprising:
a single, detachable cassette partitioned into first and second portions, said first portion comprising a photosensitive recording medium unit and said second portion comprising a developer coating portion;
said first portion including a capsule sheet roll for supplying a photosensitive recording medium and a take up roll for taking up said photosensitive recording medium, said first portion having an exposure window in a wall portion thereof, said exposure window being positioned to enable light carrying information about an original image to pass therethrough and expose said photosensitive recording medium as the photosensitive recording medium passes from said capsule sheet roll to said take up roll; and
said second portion including storing means for storing developer particles and supplying means for supplying said developer particles to said photosensitive recording medium.

8. The image recording apparatus according to claim 7, wherein said storing means is detachable from said second portion.

9. The image recording unit according to claim 7, further comprising a first electric connector provided at an exterior of said image recording unit, said first electric connector being connected with said capsule sheet roll and being connectable with a power supply to charge the photosensitive recording medium.

10. The image recording unit according to claim 9, wherein said second portion comprises charging means for electrostatically charging the developer particles and said supplying means comprises a carrying roller for carrying charged developer particles to the photosensitive recording medium.

11. The image recording unit according to claim 10, further comprising a second electric connector provided at an exterior of said image recording unit, said second electric connector being connected with a shaft of said carrying roller and a casing of said image recording unit, said second electric connector being capable of being grounded.

12. The image recording unit according to claim 9, wherein said first electric connector is insulated from a casing of said image recording unit.

13. An image recording apparatus wherein a photosensitive recording medium is exposed to light carrying information about an original image to form a latent image of the original image on the photosensitive recording medium and developer particles are subsequently coated on an exposed portion of the photosensitive recording medium to develop the latent image, said image recording apparatus comprising:
a unitary image recording unit having a photosensitive recording medium unit portion for storing the photosensitive recording medium and a developer coating unit portion for coating the developer particles on the photosensitive recording medium; and
holding means provided on a frame of said image recording apparatus for exchangeably holding said unitary image recording unit.

14. The image recording apparatus according to claim 13, wherein said photosensitive recording medium unit portion includes a capsule sheet roll for supplying the photosensitive recording medium and a take up roll for taking up the photosensitive recording medium, and said developer coating unit portion includes storing means for storing the developer particles, charging means for electrostatically charging the stored developer particles and supplying means for supplying the charged developer particles onto an exposed portion of the photosensitive recording medium supplied from the photosensitive recording medium unit portion.

15. The image recording apparatus according to claim 14, wherein said charging means is a charging roller and said supplying means is a carrying roller.

16. The image recording apparatus according to claim 15, further comprising a power supply for charging the photosensitive recording medium stored in said photosensitive recording medium unit portion to a polarity opposite to that of the electrostatically charged developer particles.

17. The image recording apparatus according to claim 16, further comprising a first electric connector provided at an exterior of said unitary image recording unit, said first electric connector being connected with said capsule sheet roll, and a second electric connector provided at said holding means, said second electric connector being connected with said power supply, the first electric connector being automatically connected with the second electric connector when said unitary image recording unit is properly installed in said image recording apparatus.

18. The image recording apparatus according to claim 17, further comprising a third electric connector provided at the exterior of said unitary image recording unit, said third electric connector being connected with a shaft of said carrying roller and a casing of said unitary image recording unit, and a fourth electric connector provided at said holding means, said fourth electric connector being grounded, said third electric connector being automatically connected with said fourth electric connector when said unitary image recording unit is properly installed in said image recording apparatus.

19. The image recording apparatus according to claim 18, wherein said first electric connector is automatically detached from said second electric connector, and said third electric connector is automatically detached from said fourth electric connector, when said unitary image recording unit is properly discharged from said image recording apparatus.

20. The image recording apparatus according to claim 19, wherein said power supply is D.C. power supply.

* * * * *